United States Patent
King

(10) Patent No.: US 7,098,472 B2
(45) Date of Patent: Aug. 29, 2006

(54) NEGATIVE DIFFERENTIAL RESISTANCE (NDR) ELEMENTS AND MEMORY DEVICE USING THE SAME

(75) Inventor: Tsu-Jae King, Fremont, CA (US)

(73) Assignee: Progressant Technologies, Inc., Mountain View, CA (US)

(*) Notice: Subject to any disclaimer, the term of this patent is extended or adjusted under 35 U.S.C. 154(b) by 0 days.

(21) Appl. No.: 11/229,182

(22) Filed: Sep. 15, 2005

(65) Prior Publication Data

US 2006/0007773 A1    Jan. 12, 2006

Related U.S. Application Data

(60) Continuation-in-part of application No. 10/884,576, filed on Jul. 2, 2004, now Pat. No. 7,016,224, which is a division of application No. 10/185,568, filed on Jun. 28, 2002, now Pat. No. 6,795,337.

(51) Int. Cl.
*H01L 31/0336* (2006.01)

(52) U.S. Cl. .............................. 257/25; 257/25; 257/8; 365/232

(58) Field of Classification Search ............... 257/25, 257/8; 365/232
See application file for complete search history.

(56) References Cited

U.S. PATENT DOCUMENTS

| | | | |
|---|---|---|---|
| 3,588,736 A | 6/1971 | McGroddy | |
| 3,903,542 A | 9/1975 | Nathanson et al. | |
| 3,974,486 A | 8/1976 | Curtis et al. | |
| 4,047,974 A | 9/1977 | Harari | |
| 4,143,393 A | 3/1979 | DiMaria et al. | |
| 4,503,521 A | 3/1985 | Schick et al. | |
| 4,644,386 A | 2/1987 | Nishizawa et al. | |
| 4,806,998 A | 2/1989 | Vinter et al. | |
| 4,945,393 A | 7/1990 | Beltram et al. | |
| 5,021,841 A | 6/1991 | Leburton et al. | |
| 5,023,836 A | 6/1991 | Mori | |
| 5,032,891 A | 7/1991 | Takagi et al. | |
| 5,084,743 A | 1/1992 | Mishra et al. | |

(Continued)

FOREIGN PATENT DOCUMENTS

EP    0747940 A2    12/1996

(Continued)

OTHER PUBLICATIONS

Barlow, P.S. et al., "Negative differential output conductance of self-heated power MOSFETs," IEE Proceedings-1 Solid-State and Electron Devices, vol. 133, Part 1, No. 5, Oct. 1986, pp. 177-179.

(Continued)

*Primary Examiner*—David Nelms
*Assistant Examiner*—Thinh T Nguyen
(74) *Attorney, Agent, or Firm*—Bever, Hoffman & Harms, LLP; Jeanette S. Harms

(57) ABSTRACT

A two-terminal NDR device can be formed by coupling the gate and drain of an NDR-capable FET, such that the coupled gate and drain form a first terminal and the source of the NDR-capable FET forms the second terminal. By applying an appropriate body bias between the body and source of an NDR-capable FET configured in this manner, the NDR-capable FET can be forced to operate with a negative threshold voltage, thereby allowing the resulting two-terminal device to exhibit the desired NDR characteristics. This two-terminal device can, for example, be used as a load element in a static random access memory (SRAM) cell and various other circuits where the NDR behavior of the device would be beneficial.

16 Claims, 4 Drawing Sheets

U.S. PATENT DOCUMENTS

| | | | |
|---|---|---|---|
| 5,093,699 A | 3/1992 | Weichold et al. |
| 5,130,763 A | 7/1992 | Delhaye et al. |
| 5,162,880 A | 11/1992 | Hazama et al. |
| 5,189,499 A | 2/1993 | Izumi et al. |
| 5,294,566 A | 3/1994 | Mori |
| 5,311,465 A | 5/1994 | Mori et al. |
| 5,357,134 A | 10/1994 | Shimoji |
| 5,390,145 A | 2/1995 | Nakasha et al. |
| 5,442,194 A | 8/1995 | Moise |
| 5,448,513 A | 9/1995 | Hu et al. |
| 5,455,432 A | 10/1995 | Hartsell et al. |
| 5,463,234 A | 10/1995 | Toriumi et al. |
| 5,477,169 A | 12/1995 | Shen et al. |
| 5,523,603 A | 6/1996 | Fishbein et al. |
| 5,543,652 A | 8/1996 | Ikeda et al. |
| 5,552,622 A | 9/1996 | Kimura |
| 5,606,177 A | 2/1997 | Wallace et al. |
| 5,608,250 A | 3/1997 | Kalnitsky |
| 5,633,178 A | 5/1997 | Kalnitsky |
| 5,689,458 A | 11/1997 | Kuriyama |
| 5,698,997 A | 12/1997 | Williamson, III et al. |
| 5,705,827 A | 1/1998 | Baba et al. |
| 5,732,014 A | 3/1998 | Forbes |
| 5,761,114 A | 6/1998 | Bertin et al. |
| 5,770,958 A | 6/1998 | Arai et al. |
| 5,773,996 A | 6/1998 | Takao |
| 5,798,965 A | 8/1998 | Jun |
| 5,804,475 A | 9/1998 | Meyer et al. |
| 5,843,812 A | 12/1998 | Hwang |
| 5,869,845 A | 2/1999 | Van der Wagt et al. |
| 5,883,549 A | 3/1999 | De Los Santos |
| 5,883,829 A | 3/1999 | van der Wagt |
| 5,895,934 A | 4/1999 | Harvey et al. |
| 5,903,170 A | 5/1999 | Kulkarni et al. |
| 5,907,159 A | 5/1999 | Roh et al. |
| 5,936,265 A | 8/1999 | Koga |
| 5,945,706 A | 8/1999 | Jun |
| 5,953,249 A | 9/1999 | van der Wagt |
| 5,959,328 A | 9/1999 | Krautschneider et al. |
| 5,962,864 A | 10/1999 | Leadbeater et al. |
| 6,015,739 A | 1/2000 | Gardner et al. |
| 6,015,978 A | 1/2000 | Yuki et al. |
| 6,075,265 A | 6/2000 | Goebel et al. |
| 6,077,760 A | 6/2000 | Fang et al. |
| 6,084,796 A | 7/2000 | Kozicki et al. |
| 6,091,077 A | 7/2000 | Morita et al. |
| 6,097,036 A | 8/2000 | Teshima et al. |
| 6,104,631 A | 8/2000 | El-Sharawy et al. |
| 6,128,216 A | 10/2000 | Noble, Jr. et al. |
| 6,130,559 A | 10/2000 | Balsara et al. |
| 6,150,242 A | 11/2000 | Van der Wagt et al. |
| 6,184,539 B1 | 2/2001 | Wu et al. |
| 6,205,054 B1 | 3/2001 | Inami |
| 6,222,766 B1 | 4/2001 | Sasaki et al. |
| 6,225,165 B1 | 5/2001 | Noble, Jr. et al. |
| 6,243,300 B1 | 6/2001 | Sunkavalli |
| 6,246,606 B1 | 6/2001 | Forbes et al. |
| 6,261,896 B1 | 7/2001 | Jun |
| 6,294,412 B1 | 9/2001 | Krivokapic |
| 6,301,147 B1 | 10/2001 | El-Sharawy et al. |
| 6,303,942 B1 | 10/2001 | Farmer, II |
| 6,310,799 B1 | 10/2001 | Duane et al. |
| 6,316,965 B1 * | 11/2001 | Jonker et al. ............... 326/134 |
| 6,353,251 B1 | 3/2002 | Kimura |
| 6,396,731 B1 | 5/2002 | Chou |
| 6,404,018 B1 | 6/2002 | Wu et al. |
| 6,424,174 B1 | 7/2002 | Nowak et al. |
| 6,479,862 B1 | 11/2002 | King et al. |
| 6,512,274 B1 | 1/2003 | King et al. |
| 6,596,617 B1 | 7/2003 | King et al. |
| 6,795,337 B1 | 9/2004 | King |
| 2001/0005327 A1 | 6/2001 | Duane et al. |
| 2001/0013621 A1 | 8/2001 | Nakazato |
| 2001/0019137 A1 | 9/2001 | Koga et al. |
| 2001/0024841 A1 | 9/2001 | Noble, Jr. et al. |
| 2001/0053568 A1 | 12/2001 | Deboy et al. |
| 2002/0017681 A1 | 2/2002 | Inoue et al. |
| 2002/0048190 A1 | 4/2002 | King |
| 2002/0054502 A1 | 5/2002 | King |
| 2002/0057123 A1 | 5/2002 | King |
| 2002/0063277 A1 | 5/2002 | Ramsbey et al. |
| 2002/0066933 A1 | 6/2002 | King |
| 2002/0067651 A1 | 6/2002 | King |
| 2002/0076850 A1 | 6/2002 | Sadd et al. |
| 2002/0093030 A1 | 7/2002 | Hsu et al. |
| 2002/0096723 A1 | 7/2002 | Awaka |
| 2002/0100918 A1 | 8/2002 | Hsu et al. |
| 2002/0109150 A1 | 8/2002 | Kajiyama |

FOREIGN PATENT DOCUMENTS

| | | |
|---|---|---|
| EP | 0747961 A2 | 12/1996 |
| EP | 0655788 B1 | 1/1998 |
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1168456 A2 | 1/2002 |
| EP | 1204146 A1 | 5/2002 |
| EP | 1251562 A1 | 10/2002 |
| JP | 8018033 A2 | 1/1996 |
| JP | 2001 01015757 A2 | 1/2001 |
| WO | WO 90/03646 A1 | 4/1990 |
| WO | WO 99/63598 A1 | 4/1999 |
| WO | WO 00/41309 A1 | 7/2000 |
| WO | WO 01/65597 A1 | 9/2001 |
| WO | WO 01/69607 A2 | 9/2001 |
| WO | WO 01/88977 A2 | 11/2001 |
| WO | WO 01/99153 A2 | 12/2001 |

OTHER PUBLICATIONS

Le Neel, O. et al., "Electrical Transient Study of Negative Resistance in SOI MOS Transistors," Electronics Letters, vol. 26, No. 1, pp. 73-74, Jan. 1990.

Mohan, S. et al., "Ultrafast Pipelined Adders Using Resonant Tunneling Transistors,"IEE Electronics Letters, vol. 27, No. 10, May 1991, pp. 830-831.

Zhang, J.F. et al., "Electron trap generation in thermally grown SIO2 under Fowler-Nordheim stress," J. Appl. Phys 71 (2), Jan. 15, 1992, pp. 725-734.

Zhang, J.F. et al., "A quantitative investigation of electron detrapping in SiO2 under Fowlerl-Nordheim stress," J. Appl. Phys. 71(12), Jun. 15, 1992, pp. 5989-5996.

Zhang, J.F. et al., "A comparative study of the electron trapping and thermal detrapping in SIO2 prepared by plasma and thermal oxidation," J. Appl. Phys. 72 (4), Aug. 15, 1992, pp. 1429-1435.

Luryi, S. et al., "Collector-Controlled States and the Formation of Hot Electron Domains in Real-Space Transfer Transistors" AT&T Bell Laboratories, pp. 1-7, 1992.

Luryi, S. et al., "Light-emitting Logic Devices based on Real Space Transfer In Complementary InGaAs/InAiAs Heterostructures" In "Negative Differential Resisitance and Instabilities in 2D Semiconductors", ed. by N. Balkan, B. K. Ridley, and A.J. Vickers, NATO ASI Series [Physics] B 307, pp. 53-82, Plenum Press (New York 1993).

Mohan, S. et al., "Logic Design Based on Negative Differential Resistance Characteristics of Quantum Electronic Devices,"IEE Proceedings-G: Electronic Devices, vol. 140, No. 6, Dec. 1993, pp. 383-391.

Mohan, S. et al., "Ultrafast Pipelined Arithmetic Using Quantum Electronic Devices," IEE Proceedings-E: Computers and Digital Techniques, vol. 141, No. 2, Mar. 1994, pp. 104-110.

Chan, E. et al., "Compact Muliple-Valued Multiplexers Using Negative Differential Resistance Devices," IEEE Journal of Solid-State Circuits, vol. 31, No. 8, Aug. 1996, pp. 1151-1156.

Chan et al., "Mask Programmable Multi-Valued Logic Gate Using Resonant Tunneling Diodes," IEE Proceedings-Circuits Devices Syst., vol. 143, No. 5, Oct. 1996, pp. 289-294.

Shao, Z et al., "Transmission Zero Engineering in Lateral Double-Barrier Resonant Tunneling Devices," Dept. Of Electrical Engineering, University of Notre Dame, pp. 1-7 (1996).

Goldhaber-Gordon, David et al., "Overview of nanoelectronic devices," Proc. IEEE, 85(4), Apr. 1997, pp. 521-540.

Koester, S. J. et al., "Negative Differential Conductance in Lateral Double-Barrier Transistors Fabricated in Strained Si Quantum Wells," Applied Physics Letters, vol. 70, No. 18, May 1997, pp. 2422-2424.

Dozsa, et al., "A transient method for measuring current-voltage characteristics with negative differential resistance regions," Research Institute for Technical Physics, P.O. Box 76, H-1325 Budapest, Hungary, (Received Jul. 24, 1997; accepted Aug. 1, 1997), 2 pages.

Pacha, C. et al., "Design of Arithmetic Circuits using Resonant Tunneling Diodes and Threshold Logic,"Lehrstuhl Bauelmente der Elektrotechnik, Universitat Dortmund, pp. 1-11, Sep. 1997.

Hansch, W. et al., "The planar-doped-barrier-FET: MOSFET overcomes conventional limitations," ESSDERC '97 27th European Solid-State Device Research Conference, Stuttgart, Sep. 22-24, 1997, 4 pages.

Wirth, G. et al., "Periodic transconductance oscillations in sub-100nm MOSFETs," ESSDERC '97 27th European Solid-State Device Research Conference, Stuttgart, Sep. 22-24, 1997, 4 pages.

Haddad, G.I. et al., "Tunneling Devices and Applications in High Functionality/Speed Digital Circuits," Solid State Electronics, vol. 41, No. 10, Oct. 1997, pp. 1515-1524.

Gardner, C. et al., "Smooth Quantum Hydrodynamic Model Simlulation of the Resonant Tunneling Diode," Dept. Of Mathematics Arizona State University, pp. 1-5, (1998).

Jungel, A. et al., "Numerical Simulation of Semiconductor Devices: Energy-Transport and Quantum Hydrodynamic Modeling,"Fachbereich Math., Tech. Univ. Berlin, Germany, pp. 1-9, 1998.

Nimour, S.M.A. et al., "Effect of Spatially Disordered Barriers on the Band Structure of Finite Superlattices," phys. stat. sol. (b) 1998, 209, No. 2, 311-318.

Rommel, S.L. et al., "Room Temperature Operation of Expitaxially Grown SI/Si0.5Ge0.5/Si Resonant Interband Tunneling Diodes," Applied Physics Letters, vol. 73, No. 14, pp. 2191-2193, 1998.

Van Der Wagt, J.P.A. et al., "RTD/HFET Low Standby Power SRAM Gain Cell," Source: Corporate Research Laboratories, Texas Instruments, 1998, 4 pages.

Sun, J.P. et al., "Resonant Tunneling Diodes: Models and Properties," Proceedings of the IEEE, vol. 86, No. 4, Apr. 1998, pp. 641-661.

Mazumder, P. et al., "Digital Circuit Applications of Resonant Tunneling Devices," Proceedings of the IEEE, vol. 86, No. 4, pp. 664-686, Apr. 1998.

News Release from www.eurekalert.org/releases/udel-udcnflb.html,"UD Computer News: Future Looks Bright for Tunnel Diodes, Promising Faster, More Efficient Circuits," Oct. 1, 1998, 4 pages.

Seabaugh A. et al., "Resonant Tunneling Mixed Signal Circuit Technology," Solid-State Electronics 43:1355-1365, 1999.

Wirth, G. et al., "Negative Differential Resistance in Ultrashort Bulk MOSFETs," IECON'99 Conference Proceedings, vol. 1, San Jose, 1999, pp. 29-34.

Mathews, R.H. et al., "A New RTD-FET Logic Family," Proceedings of the IEEE, vol. 87, No. 4, pp. 596-605, 1999.

Van Der Wagt, J.P.A., "Tunneling-Based SRAM," Proceedings of the IEEE, vol. 87, No. 4, pp. 571-595, 1999.

Heij, C.P. et al., "Negative Differential Resistance Due to Single-Electron Switching," Applied Physics Letters, vol. 74, No. 7, Feb. 15, 1999, 5 pages.

Pacha, C. et al., "Resonant Tunneling Device Logic Circuits," Microelectronics Advanced Research Initiative (MEL-ARI), Jul. 1999, pp. 1-22.

Hong, J. W. et al., "Local charge trapping and detection of trapped charge by scanning capacitance microscope in SiO2/Si system," Appl. Phys. Lett., 75(12), Sep. 20, 1999, pp. 1760-1762.

Haddab, Y. et al., "Quantized current jumps in silicon photoconductors at room temperature," J. Appl. Phys.86(7), Oct. 1, 1999, pp. 3787-3791.

Seabaugh, A., "Promise of Tunnel Diode Integrated Circuits," Tunnel Diode and CMOS/HBT Integration Workshop, Dec. 9, 1999, Naval Research Laboratory, Washington, DC., 13 pages.

Zhang, J., "Traps: Detrapping,"Wiley Encyclopedia of Electrical and Electronics Engineering Online, Article Posting Date: Dec. 27, 1998, John Wiley & Sons, Inc., 4 pages.

Zhang, J., "Traps: Effects of Traps and Trapped Charges on Device Performance," Wiley Encylopedia of Electrical and Electronics Engineering Online, Article Posting Date: Dec. 27, 1999, John Wiley & Sons, Inc., 2 pages.

Zhang, J., "Traps: Measurement Techniques," Wiley Encyclopedia of Electrical and Electronics Engineering Online, Article Posting Date: Dec. 27, 1999, John Wiley & Sons, Inc., 5 pages.

Zhang, J., "Traps, "Wiley Encyclopedia of Electrical and Electronics Engineering Online, Article Posting Date: Dec. 27, 1999, John Wiley & Sons, Inc., 2 pages.

Zhang, J., "Traps: Trapping Kinetics," Wiley Encyclopedia of Electrical and Electronics Engineering Online, Article Posting Date: Dec. 27, 1999, John Wiley & Sons, Inc., 2 pages.

Zhang, J., "Traps: Origin of Traps,"Wiley Encyclopedia of Electrical and Electronics Engineering Online, Article Posting Date: Dec. 27, 1999, John Wiley & Sons, Inc. 4 pages.

Gonzalez, A. et al.,"Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

Karna, Shashi P. et al., "Point defects in Si-SiO2 systems: current understanding," Published in G. Pacchioni et al., (eds.), "Defects in SiO2 and related dielectrics: science and technology," Kluwer Academic Publishers, (2000), 19 pages.

Geppert, Linda, "Quantum transistors: toward nanoelectronics," IEEE Spectrum, Sep. 2000, pp. 46-51.

Seabaugh, A. et al., "Tunnel-Diode IC," Minneapolis, Oct. 2, 2001, 23 pages.

Believed to be published in: Deen, Jamal (editor) et al., excerpt from "CMOS RF modeling, characterization and applications," World Scientific, Apr. 2002, 34 pages.

Scoffield, John H. et al., "Reconciliation of different gate-voltage dependencies of a 1/f noise in n-MOS and p-MOS transistors," IEEE Trans. Electron. Dev. 41(11), 11 pages.

Final Report: Smile Mel-Ari Project n.degree.28741 -Chapter V, pp. 184-194.

Villa, S. et al. "Application of 1/f noise measurements to the characterization of near-interface oxide states in ULSI n-MOSFET's," Dipartimento di Elettronica e Informazione, Politecnico di Milano (Italy), 7 pages.

Nemati, F. et al., "A Novel High Density, Low Voltage SRAM Cell With a Vertical NDR Device," Center for Integrated Systems, Stanford University, CA, (2 pages).

Nemati, F. et al., "A Novel Thyristor-based SRAM Cell (T-RAM) for High-Speed, Low-Voltage, Giga-scale Memories," Center for Integrated Systems, Stanford University, CA, (4 pages).

Shoucair F. et al.,"Analysis and Simulation of Simple Transistor Structures Exhibiting Negative Differential Resistance," EECS Department, UC Berkeley Berkeley CA, (4 pages).

Oberhuber, R. et al.,"Tunnel-Devices with Negative Differential Resistivity Based on Silicon?," Source: Deutsche Forschungsgemeinschaft and Siemens AG, date unknown, 2 pages.

Luryi, S. et al., "Collector-Controlled States in Charge Injection Transistors," SPIE-92 Symposium, pp. 1-12, 1992.

* cited by examiner

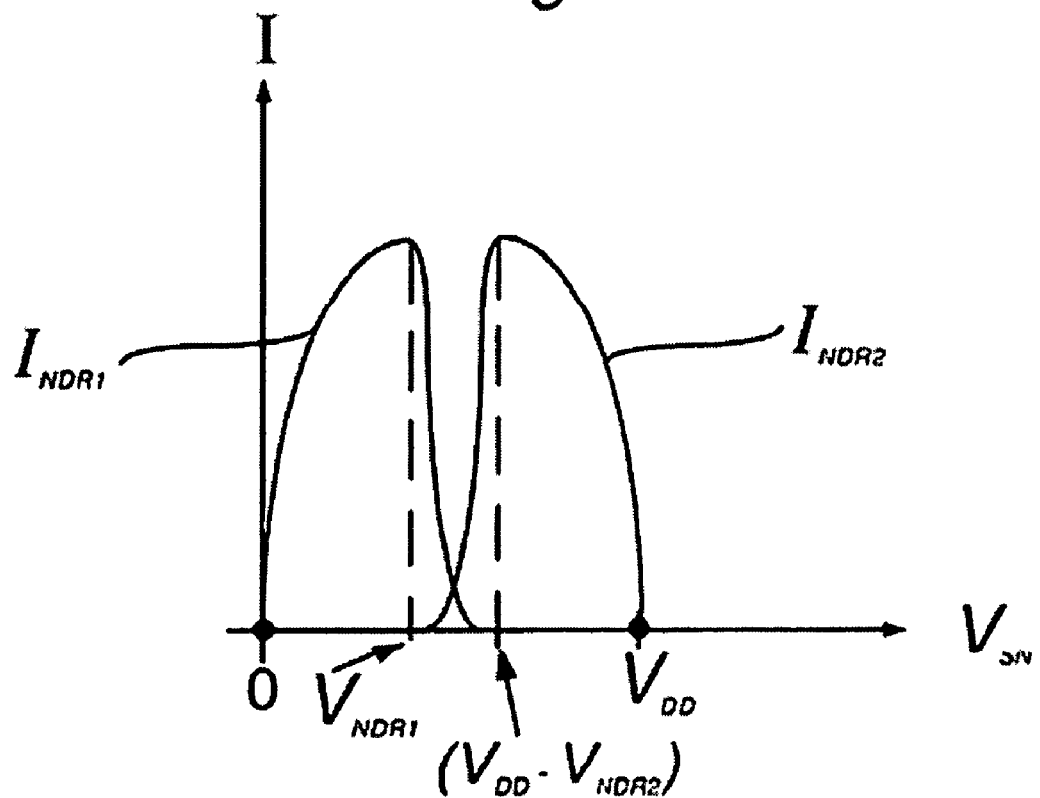

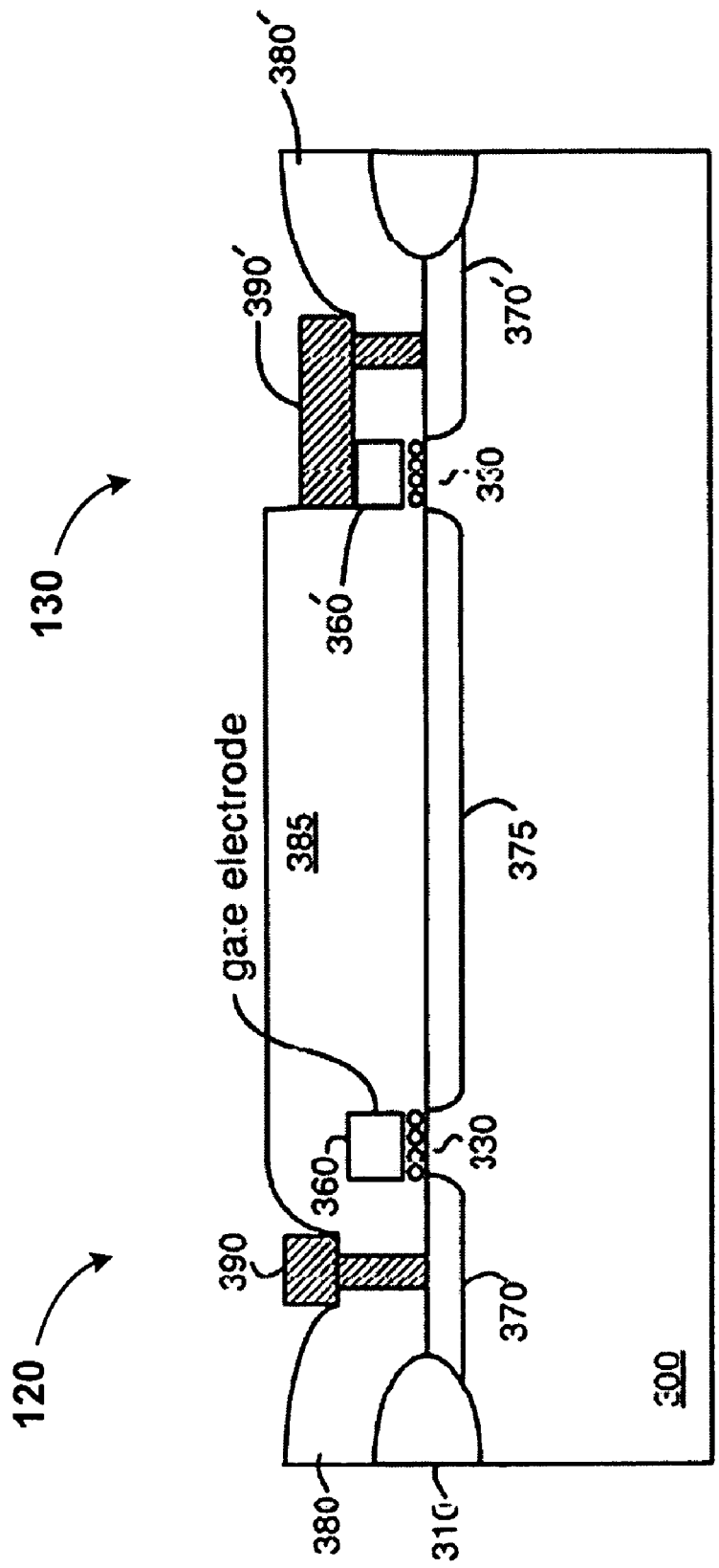

NEGATIVE DIFFERENTIAL RESISTANCE (NDR) ELEMENTS AND MEMORY DEVICE USING THE SAME

RELATED APPLICATIONS

This Application is a CIP of 10/884,576 Jul. 2, 2004 U.S. Pat. No. 7,016,224 which is a Division of Ser. No. 10/185,568 Jun. 28, 2002 U.S. Pat. No. 6,795,337

This application is a continuation-in-part of U.S. patent application Ser. No. 10/884,576, entitled "Two Terminal Silicon Based Negative Differential Resistance Device" filed Jul. 2, 2004 which is a divisional of Ser. No. 10/185,568, entitled "Negative Differential Resistance (NDR) Elements And Memory Device Using The Same" filed Jun. 28, 2002.

FIELD OF THE INVENTION

This invention generally relates to semiconductor memory devices and technology, and in particular to two terminal NDR elements and static random access memory (SRAM) devices that utilize such elements.

BACKGROUND OF THE INVENTION

The rapid growth of the semiconductor industry over the past three decades has largely been enabled by continual advancements in manufacturing technology which have allowed the size of the transistor, the basic building block in integrated circuits (ICs), to be steadily reduced with each new generation of technology. As the transistor size is scaled down, the chip area required for a given circuit is reduced, so that more chips can be manufactured on a single silicon wafer substrate, resulting in lower manufacturing cost per chip; circuit operation speed also improves, because of reduced capacitance and higher transistor current density. State-of-the-art fabrication facilities presently manufacture ICs with minimum transistor lithographically defined feature size smaller than 100 nm, so that microprocessor products with transistor counts approaching 100 million transistors per chip can be manufactured cost-effectively. High-density semiconductor memory devices have already reached the gigabit scale, led by dynamic random access memory (DRAM) technology. The DRAM memory cell consists of a single pass transistor and a capacitor (1T/1C), wherein information is stored in the form of charge on the capacitor. Although the DRAM cell provides the most compact layout (with area ranging between $4F^2$ and $8F^2$, where F is the minimum feature size), it requires frequent refreshing (typically on the order of once per millisecond) because the charge on the capacitor leaks away at a rate of approximately $10^{-15}$ Amperes per cell. This problem is exacerbated by technology scaling, because the transistor leakage current increases with decreasing channel length, and also because a reduction in cell capacitance results in a smaller number of stored charge carriers, so that more frequent refreshing is necessary. Thus, scaling of DRAM technology to much higher densities presents significant technological challenges.

Static RAM (SRAM) does not require refreshing and is generally faster than DRAM (approaching 1 ns access times as compared to tens of ns for DRAM). However, the SRAM cell is more complex, requiring either four n-channel metal-oxide-semiconductor field-effect transistors (MOSFETs) and two p-channel MOSFETs, or four n-channel MOSFETs and two polycrystalline-silicon (poly-Si) load resistors, resulting in significantly larger cell size (typically greater than $>120 F^2$). Innovations which provide significant reductions in SRAM cell size while allowing the SRAM cell to retain its favorable operating characteristics are therefore highly desirable.

Negative differential resistance (NDR) devices have previously been proposed for compact static memory applications. E. Goto in *IRE Trans. Electronic Computers*, March 1960, p. 25 disclosed an SRAM cell consisting of two resonant tunneling diodes (RTDs) and a pass transistor. For a variety of NDR devices including RTDs, the current first increases with increasing applied voltage, reaching a peak value, then decreases with increasing applied voltage over a range of applied voltages, exhibiting negative differential resistance over this range of applied voltages and reaching a minimum ("valley") value. At yet higher applied voltages, the current again increases with increasing applied voltage. Thus, the current-vs.-voltage characteristic is shaped like the letter "N". A key figure of merit for NDR devices is the ratio of the peak current to the valley current (PVCR). The higher the value of the PVCR, the more useful the NDR device is for variety of circuit applications. The PVCR of RTDs is generally not high enough to make it practical for low-power SRAM application, because in order for the RTDs in a Goto cell to have sufficient current drive, the valley current is too large, causing large static power dissipation. In addition, RTDs require specialized fabrication process sequences so that the complexity of an integrated RTD/MOSFET SRAM process would be substantially higher than that of a conventional complementary MOS (CMOS) SRAM process, resulting in higher manufacturing cost.

Accordingly, there exists a significant need for NDR devices with very high ($>10^6$) PVCR which can be easily integrated into a conventional CMOS technology, for compact, low-power, low-cost SRAM.

A new type of SRAM device to achieve such functionality using Negative Differential Resistance Field Effect Transistors (NDR FETs) is described in detail in U.S. Pat. No. 6,724,655, issued Apr. 20, 2004 to T. King and assigned to the present assignee. The NDR FET structure, operation, and method of making the same are discussed in detail in U.S. Pat. No. 6,512,274, issued Jan. 28, 2003 to King et al., which is also assigned to the present assignee. Such details are also disclosed in a corresponding PCT application PCT/US01/19825 which was published as publication no. WO 01/99153 on Dec. 27, 2001. The above materials are hereby incorporated by reference.

Additional embodiments of such device are clearly advantageous for use in memory applications, particularly embedded memory.

SUMMARY OF THE INVENTION

An object of the present invention is to provide an improved type of negative differential resistance (NDR) element to complement the types of devices available for providing a negative differential resistance characteristic in a silicon based environment.

A further object of the present invention is to provide a static random access memory (SRAM) cell which utilizes such types of new NDR elements.

For achieving these objects, one aspect of the invention provides a two terminal negative differential resistance (NDR) semiconductor device formed on a silicon-based substrate. The two terminal NDR device includes a first doped region ("drain"); a second doped region ("source"); and a gate adapted for receiving a gate control signal. The gate includes a gate electrode coupled to the first doped region. A controllable conductance region ("body") is coupled between the first and second doped regions, said controllable conductance region being configured such that when a first bias potential is applied to the gate electrode and a second bias potential is applied between the first doped region and second doped region, energetic mobile charge carriers are generated. A portion of these energetic carriers are trapped by a dielectric layer located proximate to the gate and forming an interface with the controllable conductance region. The device is configured to trap a number of the energetic carriers at or near the interface preferably using low energy level traps. Accordingly, in such device, a number of energetic carriers that can be trapped in the dielectric layer can be controlled by adjusting the first bias potential and/or the second bias potential so that the two terminal NDR semiconductor device operates as a silicon-based NDR device.

In one embodiment, the magnitude of the first bias potential (between the gate electrode and source region) required to form a conductive channel region in the controllable conductance region can be adjusted by applying a third bias potential between the controllable conductance region and the second doped region (source). Specifically, to reduce the magnitude of the first bias potential, the third bias potential can be increased.

In a preferred embodiment, the two terminal NDR semiconductor device is an NDR-capable field effect transistor (FET) which has a negative voltage threshold, and whose gate is coupled to a drain region formed in the silicon substrate. In this manner, the two terminal NDR semiconductor device operates essentially as an NDR diode.

Again, in a preferred embodiment, the controllable conductance region is a channel associated with the NDR capable FET, and which includes a first dopant that is of opposite type to a second dopant used in said first doped region and said second doped region. The charge trapping sites are also preferably characterized by an energy level that is above the conduction band edge of said channel.

In one exemplary application, the two terminal NDR semiconductor device is used as a load element within a memory cell. In such case (and in other applications) the device is coupled to a three terminal NDR semiconductor device on a common silicon substrate, where the three terminal NDR semiconductor device includes an NDR-capable field effect transistor. Furthermore, in a related aspect, the dielectric layer is used for forming charge trapping regions for both the two terminal NDR semiconductor device and the three terminal NDR semiconductor device. Further in a preferred embodiment of such type the two terminal NDR semiconductor device and three terminal NDR semiconductor device include a first channel region and a second channel region, and are formed so that the second channel region includes a concentration of doping impurities that is substantially higher than the first channel region.

Further aspects of the present invention are directed to methods of making and operating the aforementioned two terminal NDR device.

Another aspect of the invention pertains to a memory device utilizing the aforementioned two terminal NDR device as a load element. This memory device comprises a transfer field effect transistor (FET) configured to receive and/or transfer a data value from a data line to a storage node in response to a write and/or read signal respectively provided to the memory cell; and a first negative differential resistance element, the first NDR element being in the form of an NDR-capable field effect transistor (FB1) configured to receive a first gate bias signal and having a first NDR FET drain terminal coupled to the storage node, and a first NDR FET source terminal coupled to a first voltage potential at a first node; and a second negative differential resistance element, the second NDR element being a two terminal NDR-capable device configured so that a first terminal receives a second bias signal from a second voltage potential at a second node, and a second terminal is coupled to the storage node. In this fashion, the memory cell uses the negative differential resistance characteristic of the first NDR element and the second NDR element to store the data value at the storage node.

In a preferred embodiment, the first NDR element and the second NDR element are connected in series and are formed in a common substrate and with one or more common layers formed with the transfer FET.

In a preferred approach, the NDR element includes a second NDR FET that has a negative threshold voltage; however, in some embodiments, the second NDR element includes a silicon based tunneling diode. In one embodiment, a negative threshold voltage in the second NDR FET can be achieved by supplying an elevated body bias voltage to the second NDR FET. To achieve a diode like operation, the second NDR FET includes a channel doping that is substantially less than that of the first NDR FET. Further in a preferred embodiment, the first NDR element and second NDR element both use a charge trapping region that is located at an interface between an insulation layer and a substrate for each of the elements. However, in some applications, these elements use different types of charge trapping regions, such that a first charge trapping region is located within an insulation layer, while a second charge trapping region is located at an interface between such insulation layer and the substrate.

A method of operating and making the memory cell are also provided to achieve the above objects and others.

BRIEF DESCRIPTION OF THE DRAWINGS

FIG. 2 is a plot of the current-vs.-voltage characteristic of the bistable latch formed by the combination of two NDR elements depicted in FIG. 1.

FIG. 3 is a schematic cross-sectional view of an NDR-FET element connected to an NDR Diode type element, showing the various layers shared by the two elements which are co-fabricated using a single process flow.

DETAILED DESCRIPTION OF THE INVENTION

Figure 1:
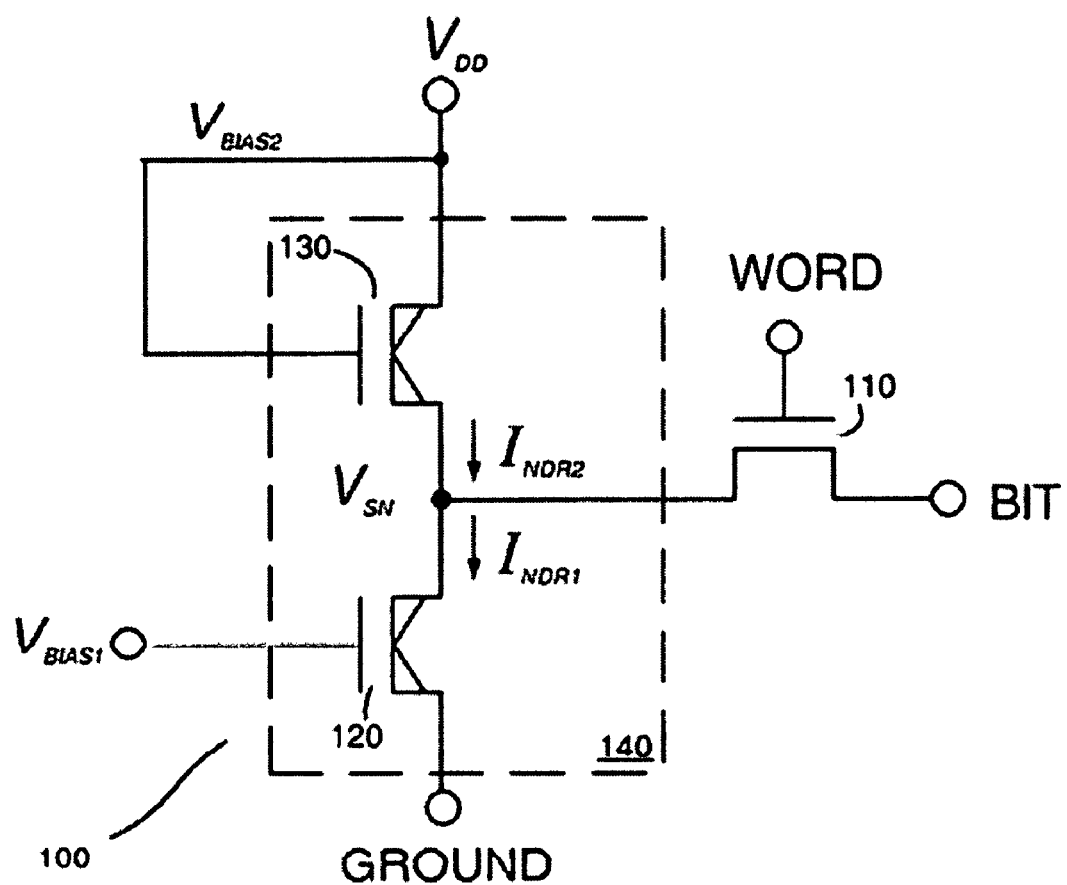
FIG. 1 is a circuit diagram of a static random access memory (SRAM) cell consisting of the combination of two NDR elements which form a bistable latch and one n-channel enhancement-mode IGFET access element, wherein at least one of the NDR elements is an NDR FET, and the other NDR element is an NDR FET configured to operate like an NDR diode.
Figure 1A:
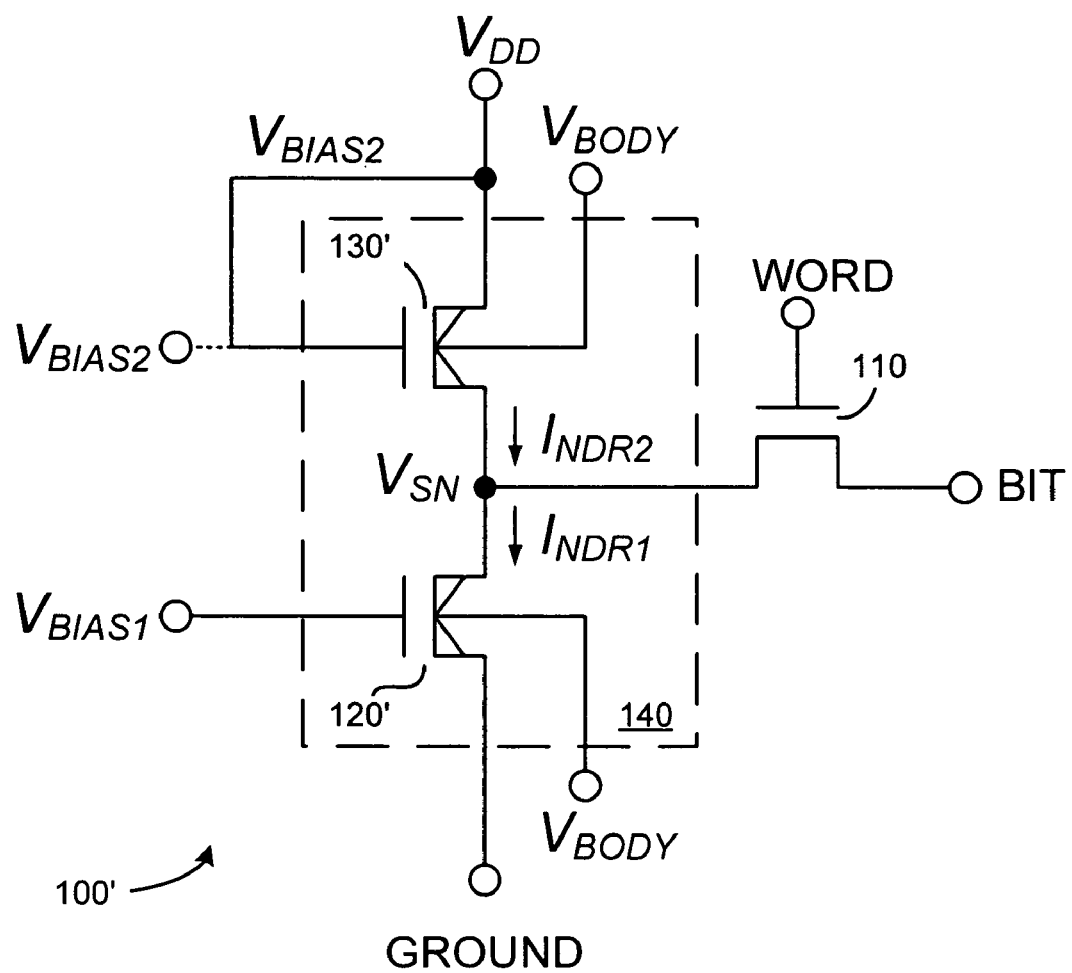
FIG. 1A is a circuit diagram of the SRAM cell of FIG. 1 with provisions for applying a desired body biasing to one or both of the NDR FETs.

A semiconductor device and memory cell according to preferred embodiments of the invention will now be described with reference to FIGS. 1, 1A, and 2. FIG. 1 is a circuit diagram of a preferred embodiment of a static memory (SRAM) cell 100 consisting of two NDR elements 120, 130 which form a bistable latch 140 and one enhancement-mode IGFET access element 110. As noted earlier, a preferred embodiment of the present invention uses a mixture of two terminal and three terminal NDR elements to form SRAM cell 100. In this respect, therefore, NDR element 120 is preferably an NDR FET, while NDR element 130 is preferably an NDR FET that is configured to operate like an NDR diode (i.e., as a two terminal NDR element).

FIG. 2 is a current-vs.-voltage plot illustrating the operational characteristics of the static memory cell 100 of FIG. 1.

NDR element 120 of the present invention is preferably an NDR FET of the type referred to above in the aforementioned King et al. applications. The details of the same are provided for example in the aforementioned applications, and such documents are incorporated by reference herein primarily for the purpose of providing non-essential background information on representative types of environments in which the present inventions can be practiced. Other types of silicon based NDR FETs are clearly suitable and encompassed within the present teachings.

In contrast to NDR element 120, NDR element 130 of the present invention is preferably an NDR FET that has been configured to be operated as a two-terminal device. To achieve such functionality, the threshold voltage preferably should be negative.

This structure for NDR element 130 is made possible by doping the channel (i.e., the controllable conductance region) of an NDR FET more lightly (as compared to NDR FET element 120)—i.e., in a preferred approach, with a net p-type concentration (preferably Boron) of less than $10^{17}/cm^3$ or thereabouts. Again, those skilled in the art will appreciate that the precise concentrations will vary in accordance with the geometry and other related processing parameters for any particular device.

The two terminal configuration of NDR element 130 is made possible by the fact that in very short channel (<100 nm) devices, the carrier velocity in the channel is high enough so that "warm" electrons are generated along a significant portion of the channel. Accordingly, a high level of doping is not needed. Thus, a type of NDR diode can be constructed from modified versions of basic NDR FET elements and employed as needed for particular applications, such as memory devices, and in those areas where its performance and characteristics are more suitable or desirable.

In one embodiment, a non-zero body bias (i.e., a body voltage greater than the baseline source voltage) can be applied to NDR element 130 (and/or first NDR element 120) to adjust the threshold voltage $V_T$ of NDR element 130 (and/or the threshold voltage of NDR element 120). The "baseline source voltage" is the lowest source voltage applied to the transistors in a circuit (typically ground). An example of this non-zero body biasing is depicted in FIG. 1A. FIG. 1A depicts a static memory cell 100' that is substantially similar to static memory cell 100 shown in FIG. 1, except that first NDR element 120' and second NDR element 130' in static memory cell 100' are coupled to receive a body bias voltage $V_{BODY}$ that applies a non-zero body bias to both NDR elements. Specifically, body bias voltage $V_{BODY}$ is selected to be greater than the baseline source voltage (in this case, the source voltage of first NDR element 120', or ground). Note that because of this similarity between static memory cells 100 and 100', all descriptions of the operation and configuration of static memory cell 100 herein can be applied to static memory cell 100'.

Typically, the standard operating condition for a MOS device involves applying a zero body bias to the MOS device (e.g., by grounding the body (bulk) terminal of the MOS device). Applying a non-zero bias to the MOS device can significantly change the behavior of that device. Specifically, applying a forward body bias (i.e., a non-zero body bias in which the body bias voltage is greater than the baseline source voltage) to the MOS device decreases the threshold voltage of the MOS device and also increases the ON current of the device (applying a reverse body bias (i.e., body bias voltage less than the baseline source voltage) has the opposite effect). In effect, the forward body bias allows a current conducting region to be formed in the channel region of the MOS device at a lower gate-to-source voltage than would be required if a zero body bias were maintained.

Thus, in one embodiment, to improve the latching behavior of static memory cell 100', body bias voltage $V_{BODY}$ can be selected to be greater than a minimum body bias voltage that causes second NDR element 130 to exhibit a zero or negative threshold voltage. In one embodiment, NDR element 130' can be formed using the same process steps as NDR element 120', but be configured to receive a different body bias voltage than NDR element 120' (e.g., NDR element 120' and NDR element 130' receive body bias voltages $V_{BODY1}$ and $V_{BODY2}$, respectively, where $V_{BODY1}$ is different from $V_{BODY2}$). For example, NDR element 130' could be formed as an enhancement mode device (e.g., having substantially the same channel doping concentration as NDR element 120', typically concentrations within 5% of each other), but through the application of an appropriate body bias voltage $V_{BODY}$, could operate as a depletion mode device. In another embodiment, both NDR device 120' and NDR device 130' could be formed such that the common body bias voltage $V_{BODY}$ only creates a negative threshold voltage for NDR device 130'. Various other body biasing schemes will be readily apparent.

Note that while increasing body bias voltage $V_{BODY}$ will reduce the threshold voltage of NDR element 130' to improve the latching behavior provided by NDR elements 120' and 130', such an increase to body bias voltage $V_{BODY}$ will also increase the static power dissipation exhibited by NDR element 120' (due to the increased forward body bias). Therefore, in one embodiment, body bias voltage $V_{BODY}$ can be limited to a maximum value of 0.5 V to maintain the power consumption of static memory cell 100' at a relatively low level while still providing enhanced latching performance.

Note also that while increasing body bias voltage $V_{BODY}$ will reduce the threshold voltage of NDR element 130' to improve the latching behavior provided by NDR elements 120' and 130', such an increase to body bias voltage $V_{BODY}$ will also increase the drain-to-source voltage at which negative differential resistance behavior is seen ($V_{NDR1}$ for NDR element 120' and $V_{NDR2}$ for NDR element 130' in FIG. 2). For proper latch operation, $V_{DD}-V_{NDR2}$ cannot be lower than $V_{NDR1}$ and hence $V_{BODY}$ can be limited to a maximum value.

Returning to FIG. 1, a preferred embodiment of an NDR element 130 is created by tying together a gate and drain of an n-channel NDR-FET structure. As with the other embodiments, the charge traps are preferably located at or near the interface between the gate dielectric and the semiconductor channel. The traps are further configured with an energy level such that they only trap energetic electrons, i.e., it is above the conduction-band edge of the semiconductor channel.

It will be appreciated, of course, that such two terminal NDR element could be used in many other applications besides SRAM where it is desirable to exploit an NDR effect.

The other elements of SRAM cell 100 include an IGFET 110 configured as a transfer gate, thereby allowing a BIT line terminal to be connected to a storage node under the control of a WORD line terminal. One of the source/drain electrodes of IGFET 110 is connected to the storage node at potential $V_{SN}$, the other source/drain electrode of IGFBT 110 is connected to the BIT line, and the gate electrode of IGFET 110 is connected to the WORD line. While it is not critical to the present invention, this IGFET 110 can be integrated optimally from a process perspective with NDR elements 120, 130 as described in the aforementioned King and King et al. applications.

From a structural perspective, a source electrode of first NDR-FET 120 is connected to a ground terminal, a gate electrode of NDR element 120 is supplied with a first bias voltage $V_{BIAS1}$, a drain region of NDR element 120 is connected together with a source region of an NDR element 130 to the storage node. The gate electrode of NDR element 130 is tied directly to the drain electrode which is supplied with a positive voltage $V_{DD}$.

The current flowing in first NDR element 120 ($I_{NDR1}$) is dependent on the difference between its drain electrode potential and its source electrode potential (i.e., storage node voltage $V_{SN}$). Current $I_{NDR1}$ first increases rapidly as $V_{SN}$ increases, reaches a peak value when $V_{SN}$ is equal to a critical voltage $V_{NDR1}$, and then rapidly decreases to nearly zero as $V_{SN}$ increases beyond the critical voltage $V_{NDR1}$. The bias voltage $V_{BIAS1}$ is sufficiently high so as to ensure that first NDR-FET 120 is turned on for values of $V_{SN}$ ranging from 0 V (ground potential) to $V_{NDR1}$.

The current flowing in second NDR element (current $I_{NDR2}$) is dependent on the difference between its drain and its source potential (i.e., $V_{DD}-V_{SN}$) Current $I_{NDR2}$ at first increases rapidly as $V_{DD}-V_{SN}$ increases, reaches a peak value when $V_{DD}-V_{SN}$ is equal to a critical voltage $V_{NDR2}$, and then rapidly decreases to nearly zero as $V_{DD}-V_{SN}$ increases beyond the critical voltage $V_{NDR2}$. As noted earlier, NDR element is an NDR FET configured to operate with a negative threshold, so a bias voltage applied to its gate is sufficiently high so as to ensure that it is turned on for values of $V_{DD}-V_{SN}$ ranging from 0 V (ground potential) to $V_{NDR2}$.

Next the preferred operation of bistable latch 140 in SRAM cell 150 of FIG. 1 will be described. FIG. 2 shows the current-vs.-voltage (I-V) characteristic curve $I_{NDR1}$ of first NDR element 120 obtained by changing the storage node voltage $V_{SN}$ in a range between 0 and $V_{DD}$, superimposed with the I-V characteristic curve $I_{NDR2}$ of second NDR element 130. A stable operating point of circuit 140 is a point where the I-V characteristic curve $I_{NDR1}$ of the first NDR element crosses the I-V characteristic curve $I_{NDR2}$ of the second NDR element and additionally the characteristic curves $I_{NDR1}$ and $I_{NDR2}$ have different gradient signs (positive, negative, or zero). (A crossing point where both of the characteristic curves and $I_{NDR1}$ and $I_{NDR2}$ have positive or negative gradient is not a stable operating point.)

Therefore it is understood that circuit 140 is stable when the potential $V_{SN}$ at the storage node is one of two values 0 and $V_{DD}-V_T$ if $V_T$ is positive or $V_{DD}$ if $V_T$ is negative as shown in FIG. 2 (where $V_T$ is a threshold voltage for NDR element 130). Accordingly, the circuit can be used as a bistable memory cell by applying a potential of one of the two values 0 and $V_{DD}$ to the WORD control terminal as a write voltage. If the value of $V_{SN}$ increases slightly above that of a low voltage (i.e., 0 volts) stable operating point, current $I_{NDR1}$ flowing in first NDR-element 120 becomes higher than the current $I_{NDR2}$ flowing in second NDR element 130, causing the value of $V_{SN}$ to be decreased toward 0 V (ground potential), to restore it to that of the stable operating point. Thus first NDR element 120 serves as a "pull-down" device. If the value of $V_{SN}$ falls slightly below that of a stable high voltage (i.e., $V_{DD}-V_T$) operating point, the current $I_{NDR2}$ flowing in second NDR element 130 becomes higher than the current $I_{NDR1}$ flowing in first NDR element 120, causing the value of $V_{SN}$ to be increased toward $V_{DD}-V_T$ to restore it to that of the stable operating point. Thus second NDR element 130 serves as a "pull-up" device.

IGFET 110 is controlled by the WORD line as follows: when the WORD line potential is sufficiently high, IGFET 110 is turned on, connecting the BIT line to the storage node to allow data transfer (reading data from the storage node, or writing data to the storage node); when the WORD line potential is low, IGFET 110 is turned off, so that the storage node is electrically isolated from the BIT line. In this manner, a bistable latch 140 is realized with two series-connected NDR elements, and a compact static memory cell is obtained by integrating latch 140 with a IGFET pass transistor 110.

It should be noted that in order to achieve low standby current in the SRAM cell, the valley currents of the NDR elements are preferably minimized, while in order to achieve a fast read access time, the peak current of the NDR elements are preferably maximized. Since the NDR element peak current and valley current are controlled by a gate bias voltage applied to an NDR FET, it is possible to achieve a very low valley current by using a lower gate bias voltage when the SRAM cell is in storage mode to achieve low static power dissipation, and to achieve a very high peak current by using a higher gate bias voltage when the SRAM cell is in read mode to achieve fast access time. In this aspect, the PVCR can effectively be enhanced by more than one order of magnitude.

As previously stated, the bias voltage (in this case, Vdd) should be sufficiently high so as to ensure that second (pull-up) NDR element 130 is turned on for values of $V_{DD}-V_{SN}$ ranging from 0 V (ground potential) to $V_{NDR2}$. Accordingly, a gate bias to NDR element 130 ($V_{DD}$) is greater than or equal to $V_{DD}+V_T$, because $V_T$ is the threshold voltage of second NDR element 130, and is configured to be <0 volts (i.e., as a depletion mode type device).

As previously stated, the bias voltage $V_{BIAS1}$ should be sufficiently high so as to ensure that first (pull-down) NDR-FET 120 is turned on for values of $V_{SN}$ ranging from 0 V (ground potential) to $V_{NDR1}$. Thus, a separate power supply voltage or a boosted supply (such as that provided by a charge pump circuit) would be needed in some instances. It should be noted that the charge pump circuit would not consume much power, as it would only supply a high voltage, with negligible current. Alternatively, $V_{BIAS1}$ can be tied or coupled to $V_{DD}$ if desired to simplify the present architecture and/or to reduce constraints on the aforementioned charge pump circuit.

FIG. 3 is a schematic cross-sectional view of two NDR elements 120 and 130 such as would be formed in representative embodiments of the present invention (IGFET element 110 is not shown, but could also be formed with common processing steps as noted earlier). For example, a common substrate 300, a common isolation area 310 and common interlayer insulation layers 380 (380') are used by NDR elements 120 and 130 respectively. Furthermore, a single gate electrode layer is used for gates 360, 360' and a single metal/contact layer 390, 390'. As depicted in FIG. 3, a gate 360' of NDR element 130 is tied to a source/drain region contact 390' which is in turn coupled to Vdd. Source/drain regions 370, 370' are formed at the same time, and a common source/drain region 375 is shared by the NDR elements. This latter region can operate as a storage node for example in the above embodiments, and can also be shared by IGFET 110. An NDR charge trapping layer 330 is included within both NDR elements, for the reasons set forth in the aforementioned referenced applications.

It should be noted that the depiction in FIG. 3 is not intended to be to scale, or to show every conceivable topography, interconnect or layout for an NDR FET and NDR Diode. Most if not all of the structures, connections, layer thicknesses, spatial relationships spacings, etc., can be deviated and still fall within the scope of the present teachings.

In another variation, a charge trapping layer for NDR elements 120 and 130 are formed at different times, based on process convenience and/or performance characteristics required of such elements. In other words, it is conceivable that a first charge trapping region might be formed right at the interface for one of the NDR elements during a first processing operation, and a second charge trapping region might be formed further within a gate dielectric (or insulation layer above the channel/junction) for the other NDR element during a second processing operation. Other such variations will be apparent to those skilled in the art.

As shown therein, for process integration purposes, a two terminal (diode-type) NDR device and a three terminal (FET-type) NDR device are combined and could be manufactured within the same process, along with a pass transistor as well. To simplify such processing, channel implants can first be performed at a light doping for both two terminal and three terminal NDR elements 120 and 130, respectively. The two terminal NDR element (130) channel region can then be masked (with any conventional technique) during a subsequent heavier channel implant for three terminal element 120. Alternatively, the heavier implant can be performed for the three terminal type NDR element 120 while the two terminal type NDR element 130 is masked, followed by a removal of the mask and a second light doping performed everywhere (for both the two terminal and three terminal elements). As these procedures are akin to what is conventionally performed for multiple-Vt CMOS technologies, the specifics of the same for any process will be apparent to those skilled in the art without undue experimentation. Alternatively the two different types of channels could be counter-doped by varying amounts. Other methods for creating dual levels of channel implants, including through the use of spin-on diffusants, will be apparent as well from the present teachings.

Note further that as described above with respect to FIG. 1A, the same channel implant process(es) can be performed for both NDR elements 120 and 130. An appropriate body bias voltage (e.g., voltage $V_{BODY}$ described with respect to FIG. 1A) could then be applied to substrate 300 (i.e., the body of NDR element 130) to cause NDR element 130 to exhibit a zero or negative threshold voltage (as described with respect to NDR element 130' in FIG. 1A).

Furthermore, for process integration purposes, it is apparent that the aforementioned two terminal and three terminal NDR elements, while preferably of the charge-trapping type noted above, need not be of the same type, or even use the same physical operational principle. Accordingly, a hybrid system of NDR elements, fabricated with conventional MOS/CMOS processing technologies, could be constructed of both tunneling and non-tunneling devices. This may be advantageous in certain applications where tunneling based devices present the most cost effective or optimal performance solution.

For instance, any other conventional NDR element that is adapted to be CMOS compatible (for example, a tunnel diode as shown in U.S. Pat. No. 6,294,412 which is incorporated by reference herein) and which requires a particular dopant implant step could be integrated with a three terminal implementation of the present invention, or two terminal implementation. For example, in the aforementioned U.S. Pat. No. 6,294,412, implants are required for a quantum well and the different p/n regions of the diode. One or more of such implant steps for a tunneling based NDR element could be performed at the same time a channel implant, or S/D implant is performed for an NDR FET (three terminal) or an NDR diode (two terminal) element. Other common and required processing steps (lithography/masking, insulation, heat treatments, interconnects) could be shared as well. Thus, it can be seen that the benefits of the present invention can be adapted for use with preexisting NDR technologies and in a cost-effective manner through integrated processing.

Finally, the present invention can also be implemented in a (partially depleted) silicon-on-insulator (SOI) substrate employed for very short channel (<50 nm gate length) transistors.

While the invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments, While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

The invention claimed is:

1. A memory cell comprising:
   a storage node;
   a transfer field effect transistor (FET), said transfer FET being configured to connect a data line to the storage node in response to at least one of a write signal and a read signal; and
   a first negative differential resistance (NDR) field effect transistor (FET), the first NDR FET comprising a first source coupled to the storage node, a first gate coupled to receive a first gate bias voltage, a first drain for receiving a first supply voltage, and a first body coupled to receive a first body bias voltage; and a second NDR FET, the second NDR FET comprising a second source coupled to receive a second supply voltage, a second gate coupled to receive a second gate bias voltage, a second drain coupled to the storage node, and a second body coupled to receive a second body bias voltage, wherein the first body bias voltage causes the first NDR FET to exhibit one of a zero threshold voltage and a negative threshold voltage.

2. The memory cell of claim 1, wherein the first gate bias voltage is equal to the first supply voltage.

3. The memory cell of claim 1, wherein a first channel doping concentration of the first NDR FET is substantially less than a second channel doping concentration of the second NDR FET.

4. The memory cell of claim 1, wherein a first channel doping concentration of the first NDR FET is substantially equal to a second channel doping concentration of the second NDR FET.

5. The memory cell of claim 1, wherein the first NDR FET, the second NDR FET, and the transfer FET share a common substrate and at least one common layer.

6. The memory cell of claim 5, wherein the common substrate is a silicon on insulator (SOI) substrate.

7. The memory cell of claim 1, wherein the storage node comprises a diffusion region shared by the first NDR FET and the second NDR FET as the first source and the second drain, respectively.

8. The memory cell of claim 7, wherein the diffusion region forms one of a source and a drain for the transfer FET.

9. The memory cell of claim 1, wherein said first NDR FET and second NDR FET both use a charge trapping region that is located at an interface between an insulation layer and a substrate for both the first NDR FET and the second NDR FET.

10. The memory cell of claim 1, wherein said first NDR FET and second NDR FET use different types of charge trapping regions.

11. The memory cell of claim 1, wherein the first body bias voltage and the second body bias voltage are equal to a common body bias voltage;

wherein the common body bias voltage is greater than the second supply voltage, and wherein the common body bias voltage is no greater than 0.5 V.

12. A method of operating a memory cell having a storage node comprising the steps of:

biasing a first negative differential resistance (NDR) field effect transistor (FET) with a first gate bias voltage to allow the first NDR FET to be operated with a first NDR characteristic;

biasing a second NDR FET with a second gate bias voltage to allow the second NDR element to be operated with a second NDR characteristic;

coupling the first NDR FET and the second NDR FET in series to form a storage node at a junction between the first NDR FET and the second NDR FET;

supplying a first body bias voltage to a first body of the first NDR FET to cause the first NDR FET to exhibit one of a zero threshold voltage and a negative threshold voltage; and operating the first NDR FET and the second NDR FET with the first NDR characteristic and the second NDR characteristic, respectively, to latch a data value at the storage node.

13. The method of claim 12, further comprising:

supplying a first voltage to a first drain of the first NDR FET;

supplying a second voltage to a second source of the second NDR FET, wherein the first gate bias voltage is equal to the first voltage.

14. The method of claim 13, wherein the second gate bias voltage is equal to the first voltage.

15. The method of claim 13, wherein the first body bias voltage is greater than the second voltage.

16. The method of claim 15, further comprising supplying the first body bias voltage to a second body of the second NDR FET, wherein the first body bias voltage is no greater than 0.5 V.

* * * * *